United States Patent
Schaeffer

(10) Patent No.: US 6,297,101 B1
(45) Date of Patent: Oct. 2, 2001

(54) METHOD FOR PRODUCING AN MOS TRANSISTOR STRUCTURE WITH ELEVATED BODY CONDUCTIVITY

(75) Inventor: Carsten Schaeffer, Treffen B. Villach (AT)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/515,088

(22) Filed: Feb. 29, 2000

(30) Foreign Application Priority Data

Mar. 1, 1999 (DE) ............................................. 199 08 809

(51) Int. Cl.[7] .................................................. H01L 21/336
(52) U.S. Cl. ......................... 438/268; 438/142; 438/270; 438/525; 438/919
(58) Field of Search ..................................... 438/133, 135, 438/138, 142, 206, 209, 212, 268, 270, 919, 524, 525

(56) References Cited

U.S. PATENT DOCUMENTS 5,283,201 * 2/1994 Tsang et al. ......................... 438/138
5,578,508 * 11/1996 Baba et al. ............................. 438/270
5,821,583 10/1998 Hshieh et al. .......................... 257/330

FOREIGN PATENT DOCUMENTS 0 708 482 4/1996 (EP) .
0 407 011 8/1996 (EP) .

* cited by examiner

Primary Examiner—Amir Zarabian
Assistant Examiner—Christian D. Wilson
(74) Attorney, Agent, or Firm—Schiff Hardin & Waite

(57) ABSTRACT

In a method is described for producing an MOS transistor structure with elevated body conductivity, a substrate layer is prepared and body regions are formed therein the body regions defining a main surface of the transistor structure and at least one channel region is also formed. Gate oxide and gate electrodes are formed in the region of the main surface, and source regions are formed that extend from the main surface into the body regions. An implantation of dopant of a first conductivity type occurs in at least a part of the channel region, this implantation dosage being controlled such that a re-doping of the body region into an area of the first conductivity type does not occur in the implantation region.

5 Claims, 5 Drawing Sheets

METHOD FOR PRODUCING AN MOS TRANSISTOR STRUCTURE WITH ELEVATED BODY CONDUCTIVITY

BACKGROUND OF THE INVENTION

1. Field of the Invention

The present invention is directed to a method for producing an MOS transistor structure with an elevated body conductivity.

2. Description of the Prior Art

MOS transistor structures of the above type can be formed as a lateral structure in which a gate electrode is arranged on a surface of the transistor structure. The source and drain terminals of the transistor structure are likewise arranged in the region of this surface. A vertical structure also can be used, in which the source and drain terminals are arranged at opposite surfaces. Instead of a gate electrode on the surface of the transistor structure, a gate electrode can be provided in a gate trench that extends from a surface of the structure into the transistor structure.

In these types of arrangements, also used to form thyristors and IGBTs, it is desirable to achieve high conductivity in the body region of the MOS transistor structure, so that when current flow stops, the effect of the parasitic transistor structure, which is unavoidably present in the arrangement, can be avoided or minimized. This problem exists when the source body diode is in a state of flow polarization when the current flow stops, and thus an injection of electrons ensues, particularly in the case of high current flow. The result is known as the latch-up effect; i.e. the parasitic transistor structure behaves as a transistor connected in the circuit. The current flow thus can no longer be cut off. As a result, the MOS transistor structure is destroyed. This can be avoided when the conductivity of the body region, which permits excess holes to be withdrawn from the body region in the direction of the contact to the body region, is increased. To accomplish this, it is necessary to increase the doping of the body region, which has the side effect of increasing the cut-off voltage of the MOS channel of the transistor structure.

U.S. Pat. No. 5,821,583 discloses a vertical MOS transistor structure with a trenched gate electrode, in which the body region has a heavily doped region, which is set back from the channel region, and a lightly doped region, which also encompasses the channel region of the transistor structure. This structure is produced by first depositing, by implantation and diffusion into a substrate, a lightly doped region, in which a heavily doped region of a smaller extent is then implanted. A disadvantage of this structure is that, while aligning the heavily doped region relative to the gate trench, the doping concentration in the channel region cannot be precisely controlled, or corresponding doping level tolerances must be accepted, and moreover only a reduced dopant concentration is present in areas of the body region that are remote from the channel region.

SUMMARY OF THE INVENTION

An object of the present invention is to provide an improved method, particularly a method which is largely independent of the alignment precision, which permits the generation of an MOS transistor structure with an elevated body conductivity.

This object is achieved by the following method in accordance with the invention.

As is conventional, a substrate layer of a first conductivity type is prepared, then body regions of the second conductivity type are formed, which adjoin the substrate layer and define a main surface. These regions can be formed by implantation or diffusion of doping material of a second conductivity type into the substrate layer, for example; alternatively, a layer of the second conductivity type can be epitaxially grown onto the substrate layer. The body regions define a main surface of the transistor structure.

Departing from conventional techniques, a gate oxide and gate electrodes are formed in the area of this main surface, and as well as source regions of the first conductivity type, which extend from the main surface into the body regions. The source regions can be produced before or after the gate electrodes are formed, depending on the production technology. Between the source regions and the substrate layer, a channel region is defined in the body regions, in which the MOS channel is developed in the finished MOS transistor structure. The gate electrodes are arranged such that each gate electrode adjoins a channel region. One or more channel regions can be provided per body region. Furthermore, in this production method, drain regions of the first conductivity type are formed, which can either be arranged in the region of the main surface or in the region of an opposite surface in the case of a vertical transistor structure. These drain regions are created at a suitable time in the process. For example, they can be formed before or after the formation of the source regions, or simultaneously with the source regions when the two regions are arranged in the area of the main surface. If the drain regions are arranged in an opposite surface, the drain regions preferably are formed during the preparation of the substrate layer.

In this production method, an implantation of doping material of the first conductivity type into the body region, at least in one part of the channel region of the body region, inventively occurs at an appropriate time. Alternatively, an implantation can occur in a larger area of the body region, but which encompasses at least part of the channel region. The implantation dose is set such that a redoping of the body region into an area of the first conductivity type does not occur in the implantation region.

Thus, a doping concentration of the first conductivity type is produced in the implantation region that is lower than the doping concentration of the second conductivity type of the body region. The total doping concentration in the implantation region is thereby reduced, so that a reduced doping concentration of the second conductivity type arises in the implantation region, and thus in at least part of the channel region. This results in a reduced cutoff voltage in the channel region compared to the conventional doping concentration of the body region. Conversely, another possible approach is to increase the doping concentration of the body region can in order to achieve an elevated body conductivity. The cutoff voltage can then be reduced again by implantation into the channel region, in order to set the cutoff voltage to the desired value in a defined manner.

On the basis of the invention, the cutoff voltage of the transistor arrangement and the conductivity of the body region can be set independently of one another.

If the inventive method is used for producing a vertical MOS transistor structure with trench-shaped gate electrodes, gate trenches are formed, which extend from the main surface to the substrate layer and which adjoin at least one body region and one source region. The source regions can be formed before or after the structuring of the gate trenches.

This is followed by the implantation of the doping material of the first conductivity type by means of at least one oblique implantation into the main surface and into the gate trenches. The oblique implantation is conducted such that each sidewall of a gate trench which adjoins a channel region is accessible to the oblique implantation, in order to implant doping material into the sidewall and thus into the channel region. If, for example, channel regions are provided in body regions that adjoin opposite sidewalls of gate trenches, then at least two oblique implantations must be provided. Following the implantation, the gate trenches can be filled with a gate oxide and with the gate electrodes. The implantation alternatively can occur after the gate oxide has been created, through the gate oxide.

The angle of the oblique implantation is selected such that the desired area of the channel region can be reached by the implantation. The angle thus may be selected coincident with the normal of the main surface, such that the entire channel region is reached and the implantation reaches even to the substrate layer under the body region. Doping material of the first conductivity type is then implanted in a particular area there as well, and a doped region of the first conductivity type having an elevated conductivity arises in the substrate layer, this region adjoining the channel region. The oblique implantation preferably is executed such that the direction of implantation describes an angle of from 20° to 60° with the normal of the main surface.

The implantation is self-aligning, since the extent (area) of the dopant is defined only by the implantation parameters, and not by a mask of photosensitive resist. The margins of the gate trenches can additionally act as masks for masking subregions of the sidewalls of the gate trenches, and thus for masking portions of the adjacent channel regions, depending on the implantation angle. An additional masking alternatively can be provided over those regions of the transistor structure which are not supposed to be influenced by the implantation, such as certain areas of the body region or the substrate layer.

The body regions can be produced in various ways, as are known in the art. They are preferably produced from a layer of the second conductivity type which has been created on the substrate layer of the first conductivity type. Gate trenches are then structured so as to divide this layer of the second conductivity type into individual body regions. The gate trenches extend from the main surface through the layer of the second conductivity type and up to the substrate layer of the first conductivity type, the layer of the second conductivity type is automatically divided into individual body regions.

The inventive method can also be used to produce an MOS transistor structure in which the gate oxide and the gate electrodes are arranged on the main surface of the transistor structure. The gate electrodes adjoin at least one body region and one source region. Beneath the gate electrodes, a channel region arises between a source region and the substrate layer. Here, the implantation of the dopant material of the first conductivity type preferably occurs prior to the formation of the gate electrodes by an implantation onto the main surface. An oblique implantation is usually not required here; the implantation can be performed perpendicularly to the main surface into the body region, or at least into parts of the channel region.

If the method is used specifically for producing an IGBT, an additional step is provided in which a layer of the second conductivity type is arranged on a surface, which is opposite the main surface, of the substrate layer.

DESCRIPTION OF THE PREFERRED EMBODIMENTS

Figure 1:
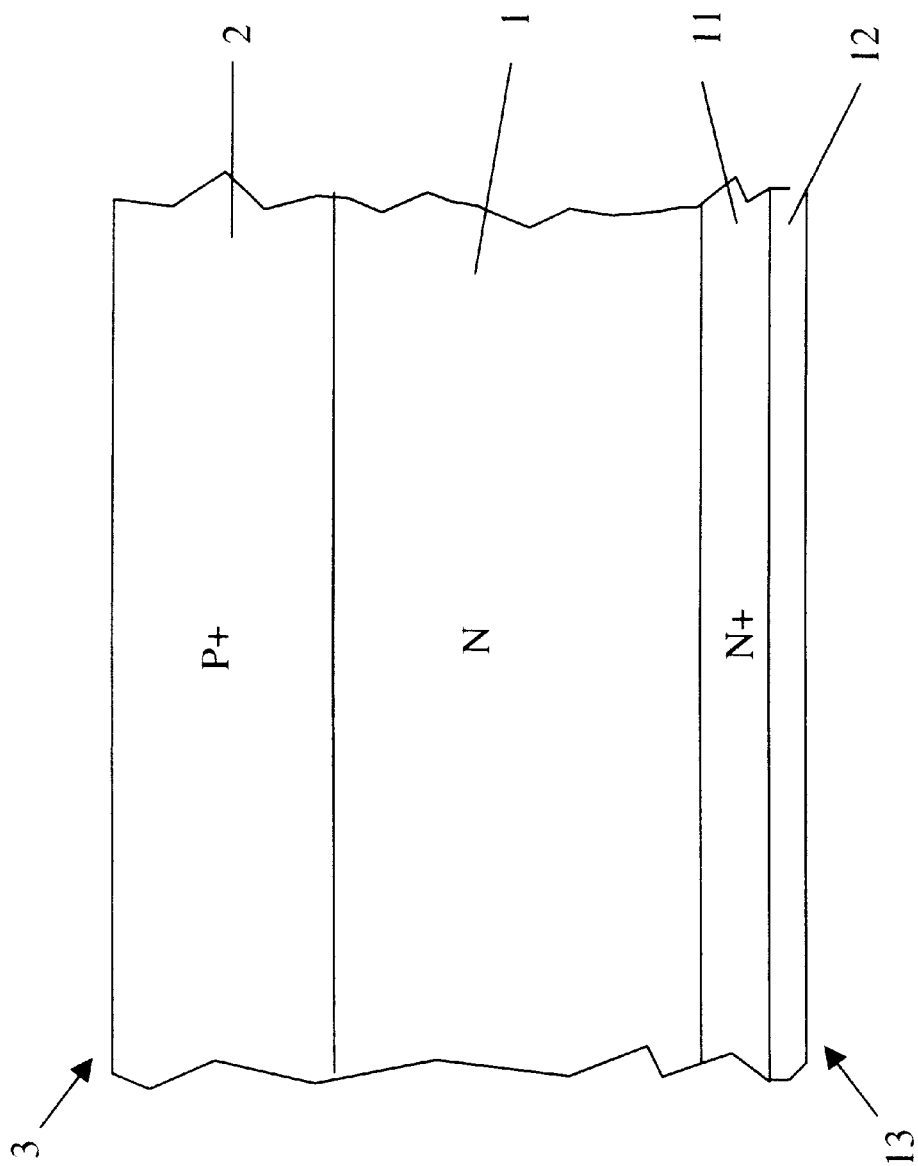
FIG. 1 shows a finished substrate layer with a drain region and a body layer as a starting point for the inventive method.

As is illustrated in FIG. 1, first an n-substrate layer 1 is prepared, on which a p+-body layer 2 is created. This can be produced by epitaxial growing, implantation or drive-in of p-dopant material, for example. The body layer 2 defines a first surface 3 of the structure. In the region of a second, opposite surface 13, an n+-drain region 11 is provided. A metallization 12 is arranged on this layer.

Figure 2A:
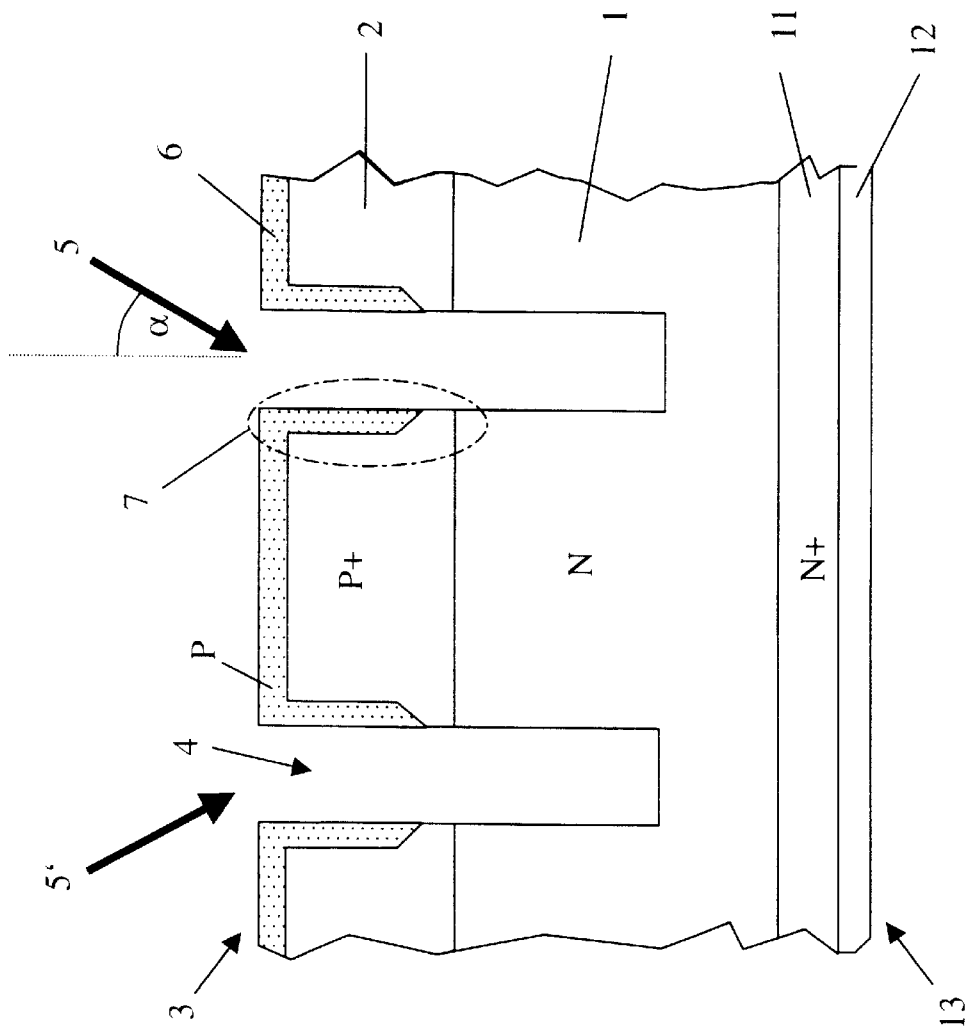
FIGS. 2a and 2b are sections of the structure of FIG. 1, following the formation of gate trenches and oblique implantations onto the main surface and into the gate trenches in accordance with the inventive method.

FIG. 2a depicts a section of the structure according to FIG. 1. Gate trenches 4 have been structured through the p+-body layer 2, which trenches extend through the body layer 2 up to the substrate layer 1. The body layer is thus divided into individual body regions 2. The later channel regions 7 are situated in the areas of the body regions 2 that adjoin the gate trenches 4.

Now at least two oblique implantations 5 are carried out, with the direction of implantation forming an angle $\alpha$ with the normal of the first surface 3. This angle $\alpha$ can be between 20° and 60°. The implantations occur such that n-type dopant is implanted into the body regions 2 in the area of the first surface 3 as well as in a subarea, which encompasses at least one subarea of the later channel regions 7, of the sidewalls of the gate trenches 4. The dosage of the implantations is set such that the p+-body regions in the implantation regions 6 are not completely redoped into areas of n conductivity type. The resulting doping in the implantation regions 6 is merely reduced by a compensation effect, so that a high p+-doping is no longer present in this area; but rather, only a reduced p-doping. The implantation dosage and the angle of the oblique implantation are adjusted so that a defined area of the channel regions 7 is exposed to this implantation, and so that the resulting doping is reduced in this area such that the desired cutoff voltage for this later channel region can be set.

Figure 2B:
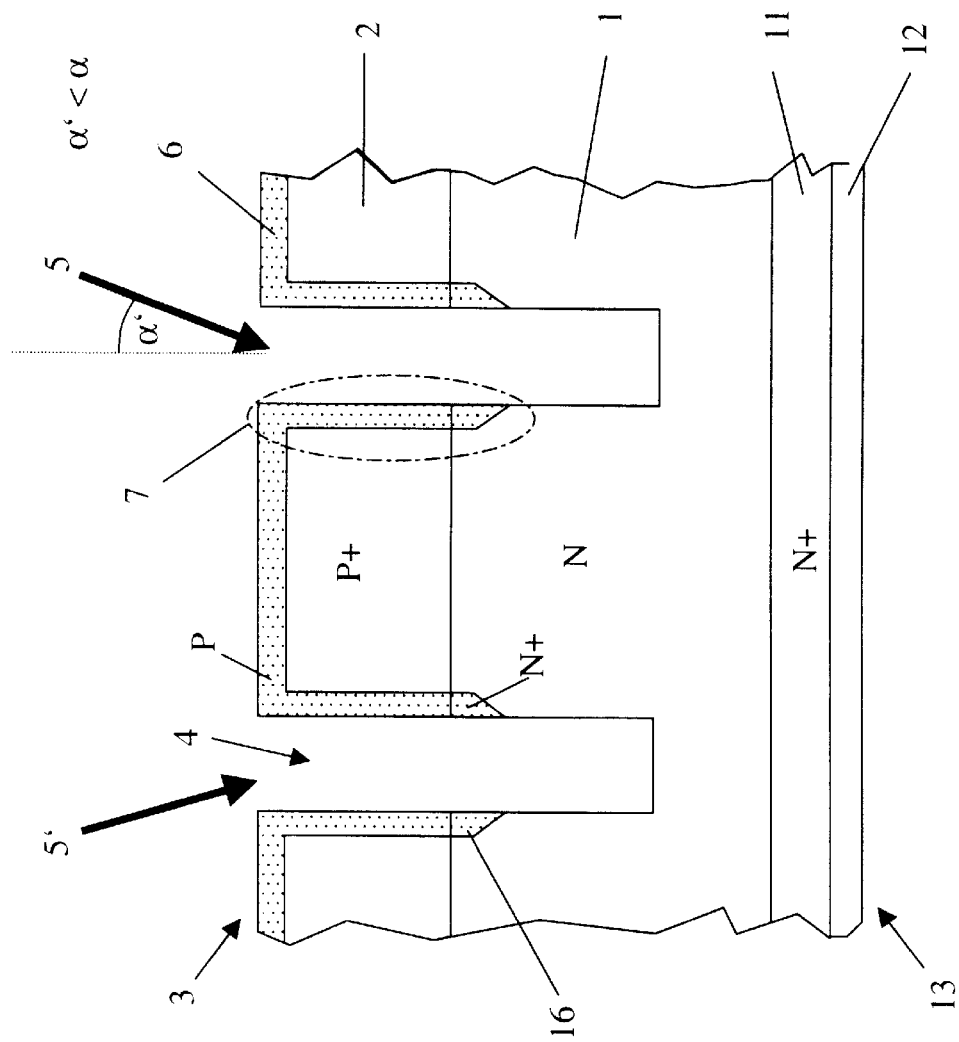

FIG. 2b illustrates an alternative variant of this method. Here, the oblique implantation is performed with an angle $\alpha'$, which is smaller than the angle $\alpha$ and which is selected such that the substrate layer 1 under the body regions 2 can also be reached by the implantation. Dopant of the first conductivity type thus is implanted in the area of the entire channel region 7, and the effective doping thus is reduced. At the same time, in an area 16 under the channel region 7, the doping of the substrate layer 1 is elevated, so that n+-regions 17 having higher conductivity arise.

Figure 3:
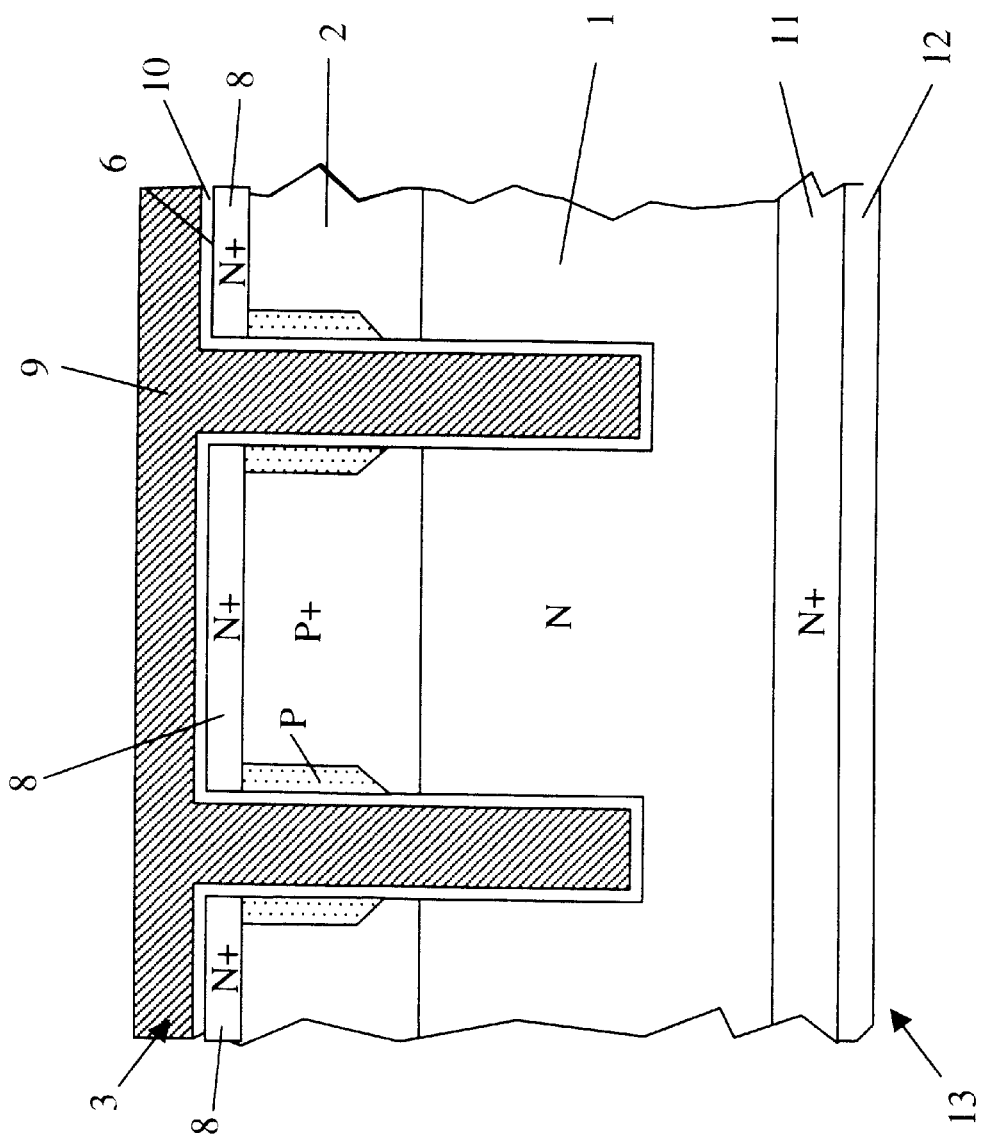
FIG. 3 is a section of the structure of, following the formation of the source regions and the gate electrodes in accordance with the inventive method.

Subsequent to these steps, as FIG. 3 illustrates, the source regions 8 are formed in the area of the first surface 3 of the transistor structure. The formation of these n+-source regions can be achieved by another, but perpendicular, implantation of n-type dopant. The implantation for forming the n+-source regions thus occurs with a higher implantation dosage, which now causes a redoping of the body regions in the area of the first surface 3, as a result of which n+-regions 8 are formed. This is followed by the formation of a gate oxide 10 on the transistor structure and a filling of the gate trenches 4 with gate electrodes 9 by the deposition of a conductive layer, preferably a polycrystalline silicon layer.

Figure 4:
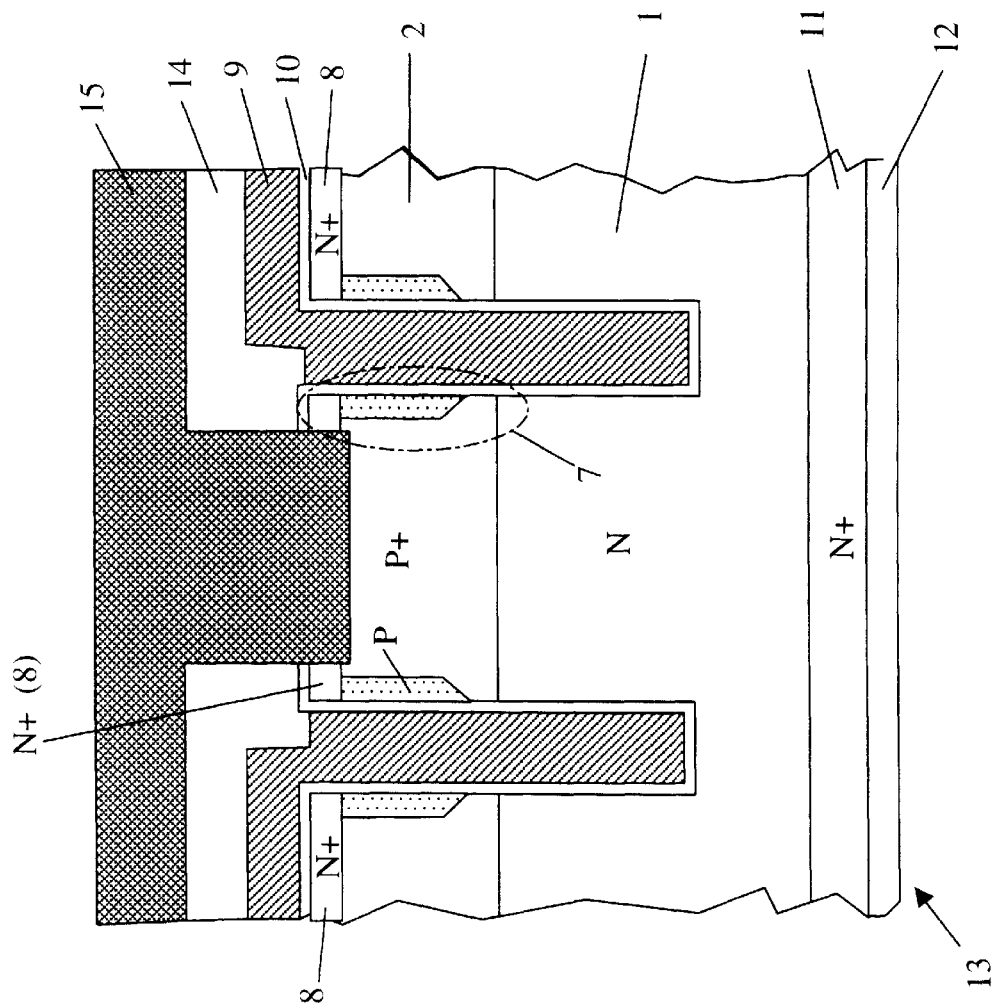
FIG. 4 is a section of the structure of FIG. 3, following the formation of the gate insulation layer and the contacting of the source regions and the body region in accordance with the inventive method.

Finally, as illustrated in FIG. 4, the conductive layer for forming the gate electrodes 9 is partially removed again, and an oxide layer 14 is formed over the gate electrodes and at least parts of the source regions 8. This is followed by a contacting of the source regions 8 and the body regions 2 by a metallization layer 15.

As FIG. 4 illustrates, a part of each channel region 7 now has only a reduced doping concentration of type p, resulting in the cutoff voltage of the MOS transistor structure being reduced. This means that the remaining body region can have a significantly higher doping of type p+ without the cutoff voltage being elevated compared to a conventional body region having a doping of type p. The conductivity of the body region thus is elevated appreciably, but without adversely affecting the cutoff voltage of the MOS transistor structure.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for producing an MOS transistor structure, comprising the steps of:

providing a substrate layer of a first conductivity type;

forming a body region of a second conductivity type adjoining said substrate layer, said body region of a second conductivity defining a primary surface;

forming source regions of said first conductivity type at said primary surface and extending into said body region and thereby defining at least one channel region between two of said source regions and said substrate layer;

forming a gate trench in said channel region proceeding from said primary surface to said substrate layer, said gate trench having a sidewall;

obliquely implanting dopant of said first conductivity type into said channel region to dope at least an upper portion of said sidewall of said gate trench, and using an implantation dosage so that substantially no redoping of said body region, other than at said upper portion of said sidewall, into said first conductivity type occurs, other than at said upper portion of said sidewall, and said body region retains said second conductivity type; and forming a gate oxide and a gate electrode in said gate trench.

2. A method as claimed in claim 1 wherein said primary surface has a surface normal, and comprising obliquely implanting said dopant of said first conductivity type at an angle in a range between 20° and 60° to said surface normal.

3. A method as claimed in claim 1 comprising dividing said body region of said second conductivity type into a plurality of discrete body regions by forming a plurality of gate trenches in said body region of said conductivity type.

4. A method as claimed in claim 1 comprising implanting doping material of said first conductivity type by implantation onto said primary surface, and forming said gate oxide and said gate electrodes on said primary surface to adjoin at least one of said body regions and one source region.

5. A method as claimed in claim 1 comprising forming a layer of said second conductivity type on a surface of said substrate layer which is opposite to said primary surface.

* * * * *